United States Patent
Pavao Moreira et al.

(10) Patent No.: US 10,211,817 B2
(45) Date of Patent: Feb. 19, 2019

(54) LOW VOLTAGE DIFFERENTIAL SIGNALLING DEVICE

(71) Applicant: NXP B.V.

(72) Inventors: Cristian Pavao Moreira, Frouzins (FR); Birama Goumballa, Larra (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/849,555

(22) Filed: Dec. 20, 2017

(65) Prior Publication Data

US 2018/0183418 A1 Jun. 28, 2018

(30) Foreign Application Priority Data

Dec. 22, 2016 (EP) .................................... 16306787

(51) Int. Cl.
| | | |
|---|---|---|
| *H03B 1/00* | (2006.01) | |
| *H03K 3/00* | (2006.01) | |
| *H03K 19/09* | (2006.01) | |
| *H03K 17/16* | (2006.01) | |
| *H03M 1/06* | (2006.01) | |
| *H03K 5/08* | (2006.01) | |
| *H03K 19/0185* | (2006.01) | |
| *G05F 3/26* | (2006.01) | |

(52) U.S. Cl.
CPC ............... *H03K 5/08* (2013.01); *G05F 3/262* (2013.01); *H03K 19/018528* (2013.01)

(58) Field of Classification Search
CPC .......... H03K 5/08; H03K 3/00; H03K 19/094; G05F 3/262
USPC .. 327/52, 53, 58, 60, 62, 63, 65–69, 71, 72, 327/74, 77–81, 88, 89, 96, 127, 246, 266, 327/274, 280, 287, 359, 560–563; 326/22–27, 81–87
See application file for complete search history.

(56) References Cited

U.S. PATENT DOCUMENTS

| | | | | |
|---|---|---|---|---|
| 4,800,339 A | * | 1/1989 | Tanimoto | H03F 3/3001 330/253 |
| 6,285,232 B1 | * | 9/2001 | Hasegawa | H03K 19/00384 327/108 |
| 7,538,588 B2 | * | 5/2009 | Liu | H04L 25/0272 326/83 |
| 7,893,719 B2 | * | 2/2011 | Lee | H03K 19/01852 326/115 |

(Continued)

FOREIGN PATENT DOCUMENTS

JP 2013-118566 A 6/2013

OTHER PUBLICATIONS

Ta, P.D. "A low power clock distribution scheme for complex IC system", Proceedings Fourth Annual IEEE International ASIC Conference and Exhibit, Rochester, NY, pp. P1-5/1-4 (1991).

*Primary Examiner* — Brandon S Cole
(74) *Attorney, Agent, or Firm* — Rajeev Madnawat

(57) ABSTRACT

A LVDS device, comprising: a first pair of switches, operable to drive current from a first output to a second output through a differential signalling circuit; a second pair of switches, operable to drive current from the second output to the first output through the differential signalling circuit; a voltage limiter, connected in series with the first and second pair of switches, operable to receive a control voltage and, responsive to the control voltage, to limit a voltage at each of the first and second output to less than a clamping voltage when current is driven through the differential signalling circuit.

15 Claims, 7 Drawing Sheets

(56) References Cited

U.S. PATENT DOCUMENTS

| | | | |
|---|---|---|---|
| 7,898,295 B1 | 3/2011 | Kasturirangan et al. | |
| 9,083,584 B2* | 7/2015 | Lee | H04L 25/085 |
| 9,513,655 B1* | 12/2016 | Liu | G05F 5/00 |
| 2005/0174148 A1* | 8/2005 | Fiedler | H03K 5/08 |
| | | | 327/65 |
| 2006/0267634 A1* | 11/2006 | Koo | H04L 25/0272 |
| | | | 326/86 |
| 2006/0284649 A1* | 12/2006 | Cho | H03K 17/04106 |
| | | | 326/83 |
| 2007/0127518 A1* | 6/2007 | Liu | H04L 25/0272 |
| | | | 370/463 |
| 2008/0116943 A1* | 5/2008 | Nair | H03K 19/01852 |
| | | | 327/108 |
| 2009/0174439 A1* | 7/2009 | Luo | H03K 19/01852 |
| | | | 327/108 |
| 2010/0066450 A1* | 3/2010 | Palmer | H03F 3/45179 |
| | | | 330/261 |
| 2016/0141358 A1* | 5/2016 | Salcedo | H01L 29/0646 |
| | | | 257/168 |

\* cited by examiner

LOW VOLTAGE DIFFERENTIAL SIGNALLING DEVICE

CROSS-REFERENCE TO RELATED APPLICATIONS

This application claims the priority under 35 U.S.C. § 119 of European Patent application No. 16306787.9, filed on Dec. 22, 2016, the contents of which are incorporated by reference herein.

FIELD

The present disclosure relates to a low voltage differential signalling device.

BACKGROUND

Low voltage differential signalling (LVDS) is a serial communication method that is widely used. Information is communicated as the difference in voltage between two conductors (e.g. wires). In a typical implementation, the two conductors are connected at the termination end by a 100 ohm resistor, and constant current is injected into the wires. The direction of current flow through the termination resistor determines the digital logic level of the voltage difference between the conductors at the termination end. The receiver senses the polarity of this voltage difference to determine the logic level. A common mode voltage is applied to both conductors. Typical current flows may be around 3.5 mA, resulting in a typical voltage difference of around 350 mV across the termination resistor. A relatively low common mode voltage may be used, for example, 600 mV.

Different process technologies have different operating voltage requirements. Process nodes with small half-pitch dimensions have reduced voltage requirements and a reduced maximum voltage. In contrast, high speed signal processing may require heterojunction devices with higher voltage requirements and a higher maximum voltage. Communications between dice with different process technologies may be necessary, and it is typically desirable to minimise the number of external components in electronic systems, which reduces cost and keeps the size of the system to a minimum. A single chip solution is generally preferable to a multi-chip module or system in a package. A multi-chip module or system in package is generally preferable to a requirement for a large area of printed circuit board comprising several off-chip components. It is therefore not always practical to provide an external passive termination resistor in an LVDS receiver. A solution that enables LVDS communication between integrated circuits with dissimilar process technologies is desirable.

SUMMARY

According to a first aspect, there is provided a LVDS device, comprising:

a first pair of switches, operable to drive current from a first output to a second output through a differential signalling circuit;

a second pair of switches, operable to drive current from the second output to the first output through the differential signalling circuit; and a voltage limiter, connected in series with the first and second pair of switches, operable to receive a control voltage and, responsive to the control voltage, to limit a voltage at each of the first and second output to less than a clamping voltage when current is driven through the differential signalling circuit.

The voltage limiter may comprise a first regulating transistor in series with the first pair of switches, and a second regulating transistor in series with the second pair of switches, the control voltage applied to the gate of each of the first and second regulating transistor.

The device may further comprise a voltage generator configured to provide a reference voltage. The voltage generator may be a programmable voltage generator.

The device may further comprise a regulator configured to generate the control voltage from a reference voltage (which may be the reference voltage from the voltage generator, or the reference voltage may be provided external to the device).

The regulator may comprise a buffer that receives the reference voltage and provides a buffered output voltage substantially equal to the reference voltage.

The buffer may comprise a first buffer transistor and a second buffer transistor, the first and second buffer transistor configured with nominally identical threshold voltage.

The regulator may further comprise a third transistor, the buffered output voltage being provided to the source of the third transistor, and the control voltage being provided from the gate of the third transistor.

The first transistor, second transistor and third transistor may be configured with a nominally identical threshold voltage.

The regulator may comprise a clamp enable switch, operable to connect and disconnect the control voltage from the voltage limiter.

The regulator may further comprise a clamp removal switch, operable to provide a control voltage (e.g. a supply voltage) that: causes the voltage limiter to stop limiting the voltage difference and reduces the effective series resistance of the voltage limiter.

According to a second aspect, there is provided a first integrated circuit comprising the device of the first aspect. The first integrated circuit may comprise heterojunction transistors. The first integrated circuit may comprise a radar transceiver. The first integrated circuit may have a first maximum operating voltage and/or a nominal supply voltage.

According to a third aspect, there is provided a system comprising a second integrated circuit, comprising an LVDS receiver configured to receive LVDS signals from the LVDS device of the first integrated circuit The second integrated circuit may comprise a microcontroller. The second integrated circuit may have a second maximum operating voltage that is less than the first maximum operating voltage and/or the first nominal supply voltage. The second integrated circuit may comprise a switchable termination resistance for the differential signalling circuit, the switchable termination resistance operable in a first state to provide a first termination resistance between a first and second output of the differential signalling circuit, and operable in second state to provide a second termination resistance that is lower than the first termination resistance between the first and second output of the differential signalling circuit. The second termination resistance may be less than 200 ohms, preferably around 100 ohms. The first termination resistance may be at least five times the second termination resistance.

The system may be configured to: during a startup period of the second integrated circuit, enable voltage regulation using the voltage limiter (for example by operating the clamp enable switch), and after the startup period, disable voltage regulation by the voltage limiter (for example by operating the clamp removal switch).

During a startup period, the switchable termination resistance may be in the first state (i.e. with a relatively high resistance, as described above)

Systems in accordance with the present disclosure may enable different LVDS receivers with switchable load resistance (and which may include switchable common mode voltage generation) to be coupled to an LVDS transmitter with an overvoltage protection circuit.

Methods in accordance with the present disclosure may protect a second integrated circuit from an overvoltage condition coming from a first integrated circuit in an LVDS interface, for any configuration and state of the LVDS load termination (at the second integrated circuit) and state of LVDS driver (at the first integrated circuit).

Each feature of each aspect may be combined with the features of each other aspect, as appropriate.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
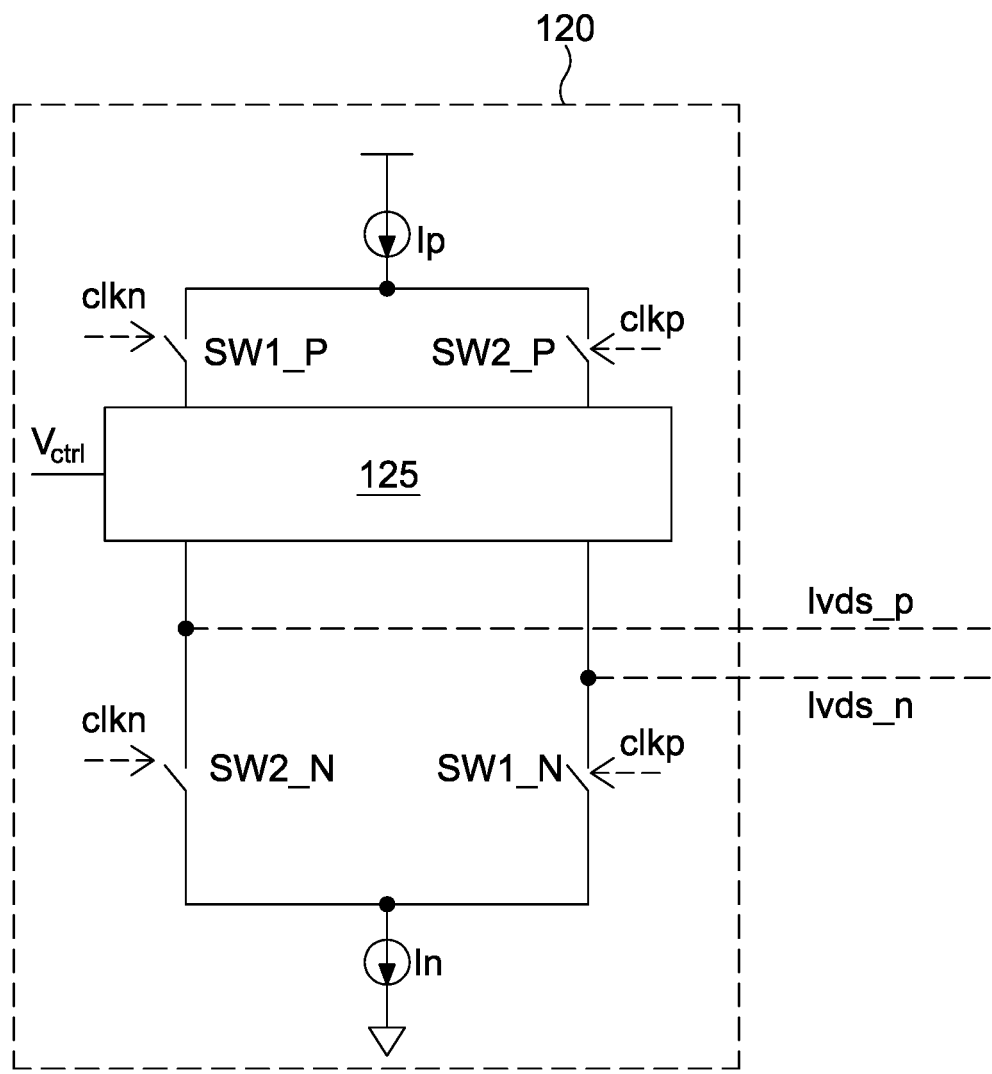
FIG. 1 is schematic circuit diagram of an example LVDS driver device according to an embodiment.

It should be noted that the figures are diagrammatic and not drawn to scale. Relative dimensions and proportions of parts of these figures may be shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 is a schematic diagram of an LVDS driver 120. The LVDS driver 120 comprises: a first pair of switches SW1_P and SW1_N, a second pair of switches SW2_P and SW2_N, a current source Ip, a current sink In and a voltage limiter 125. The LVDS driver 120 has a first output lvds_p and a second output lvds_n. The first pair of switches SW1_P and SW1_N are operable to drive current from the first output lvds_p to the second output lvds_n through a differential signalling circuit (e.g. through a termination resistance at an LVDS receiver, external to the driver 120).

When SW1_P and SW1_N are closed, current will flow from the current source Ip, through SW1_P, out of the first output lvds_p, through the external termination resistance (not shown), and return via the second output lvds_n to flow to the current sink In via SW1_N. When SW2_P and SW2_N are closed, current will flow from the current source Ip, through SW2_P, out of the second output lvds_n, through the external termination resistance (not shown), and return via the first output lvds_p to flow to the current sink In via SW2_N.

In operation, the first pair of switches SW1_P, SW1_N are closed when the second set of switches SW2_P, SW2_N are open, and vice versa. SW1_P and SW2_P are conveniently p-type MOS transistors opened and closed by a clkn and clkp signals, respectively applied to their gate, with SW1_N and SW2_N conveniently being n-type MOS transistors opened and closed by a clkp and clkn signals, respectively, applied to their gate.

The voltage limiter 125 is connected in series with the first and second pair of switches SW1_P, SW1_N, SW2_N, SW2_P, in this case between SW1_P and the first output lvds_p and between SW2_P and the second output lvds_n. The voltage limiter 125 is operable to receive a control voltage $V_{ctrl}$ and responsive to the control voltage $V_{ctrl}$, to limit a voltage on each of the first and second output lvds_p, lvds_n to less than a clamping voltage when current is driven through the differential signalling circuit by the device 120.

The voltage limiter 120 may be any suitable means for limiting the voltage. A suitable example is shown in more detail in FIG. 3, which will be described in more detail below.

Figure 2:
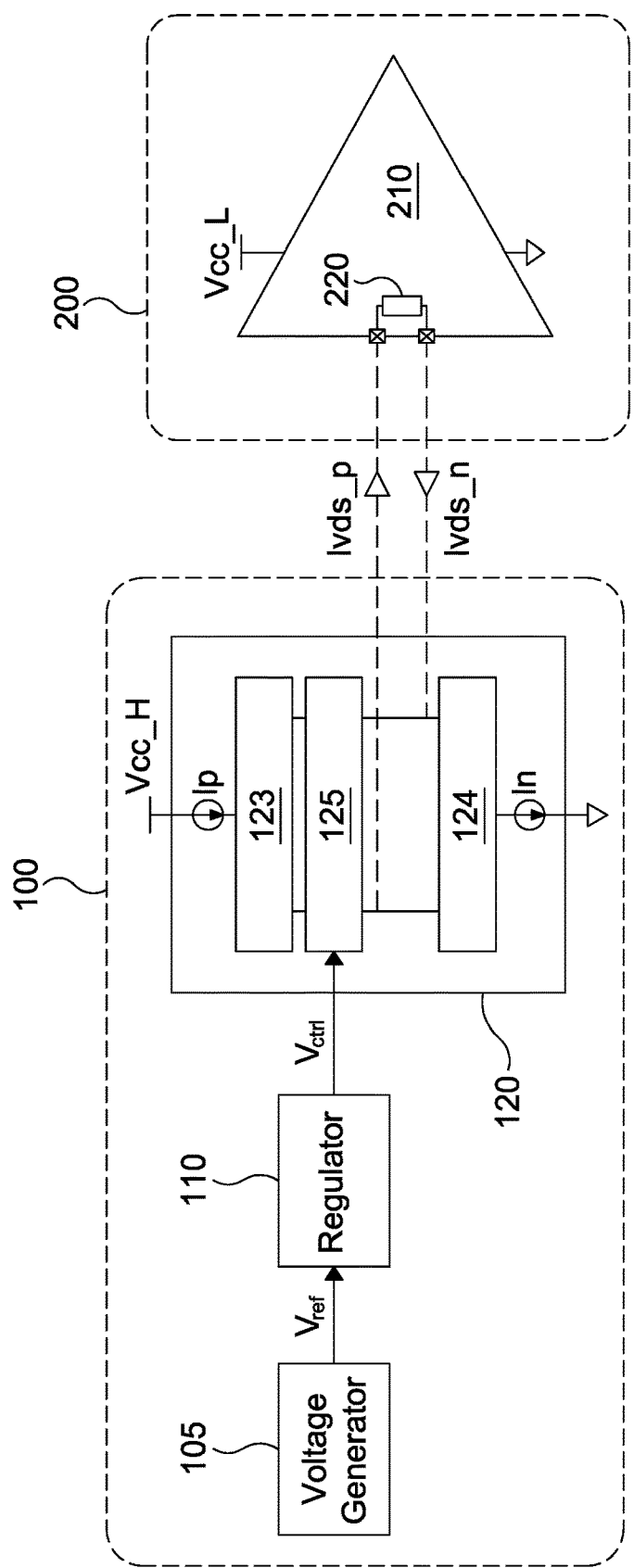
FIG. 2 is a block diagram of an example system according to an embodiment.

FIG. 2 illustrates the LVDS driver 120 in the context of a system which comprises an LVDS device 100 comprised as part of a first integrated circuit and a second integrated circuit 200. The device 100 comprises voltage generator 105, regulator 110, and LVDS driver 120. The second integrated circuit 200 comprises an LVDS receiver 210. A first conductor lvds_p and second conductor lvds_n connect the LVDS driver 120 to the LVDS receiver 210, which detects the voltage across a termination resistance 220 resulting from current flowing through the first and second conductors lvds_p, lvds_n.

The first integrated circuit may comprise a transceiver (such as a radar transceiver) implemented in a first process technology, such as a bipolar CMOS heterojunction technology (e.g. SiGe) having a voltage Vcc_H, which may be appropriate for handling very high frequency signals (e.g. greater than 50 GHz or 70 GHz). The second integrated circuit 200 may comprise a micro-controller unit, implemented in a second process technology, such as a low voltage silicon CMOS process (having a supply voltage Vcc_L). The LVDS driver 120 may be used to share a clock signal from the first integrated circuit (which may be generated or received by the first integrated circuit). Sharing the same clock signal between the first and second integrated circuit helps to keep the cost of the system down by reducing the number of components required.

Implementing the first 100 and second integrated circuit 200 in different technologies may enable better optimisation of system performance, but can create some incompatibilities. The maximum operating voltage for a low voltage CMOS technology may be less than a supply voltage (Vcc_H) for a bipolar heterojunction technology. It would therefore be possible for a conventional LVDS driver in the first integrated circuit to cause an over-voltage condition at the input of the LVDS receiver 210, which may damage the second integrated circuit 200. This can be prevented by the use of an LVDS driver 120 with a voltage limiter 125, as shown in FIG. 2.

The voltage generator 105 may be a programmable bandgap referenced voltage generator. The reference voltage $V_{ref}$ output from the voltage generator 105 may be selectable to be a value that is less than the maximum voltage tolerable by the second integrated circuit 200. The use of a programmable voltage generator therefore makes the device 100 applicable in a wide range of contexts, to provide communication between devices realised in a range of different process technologies (and/or having different maximum tolerable voltage).

The regulator 110 is configured to generate the control voltage $V_{ctrl}$ from the reference voltage $V_{ref}$. An example regulator 110 is explained in more detail below, with reference to FIG. 3.

The LVDS driver 120 in the example of FIG. 2 is substantially the same as already discussed with reference to FIG. 1, with switch SW1_P and SW2_P represented by box 123 and SW1_N and SW2_N represented by box 124.

Figure 3:
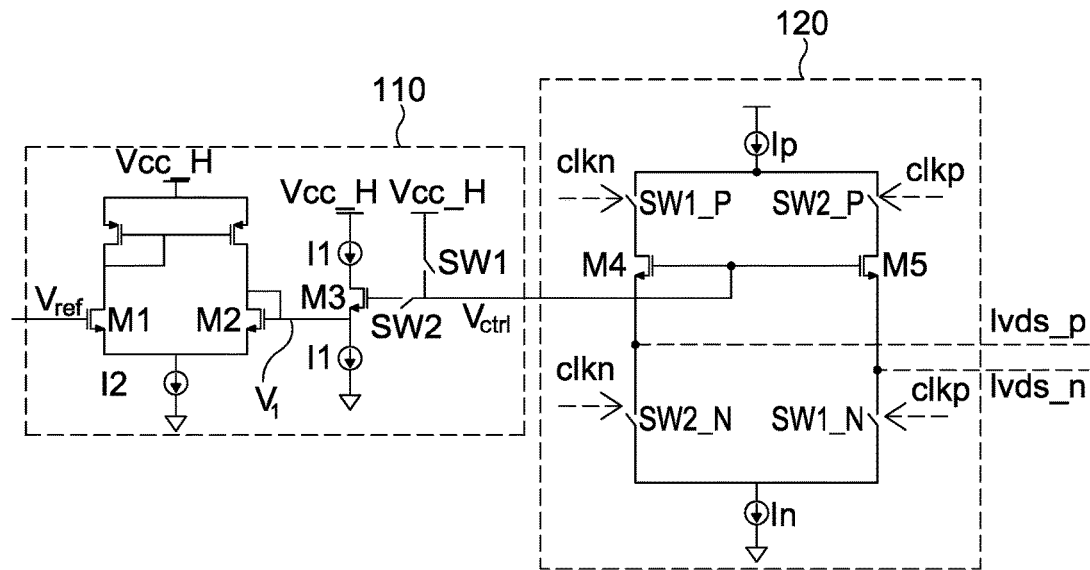
FIG. 3 is a more detailed circuit schematic of an example regulator and LVDS driver.

FIG. 3 illustrates the regulator 110 and LVDS driver 120 in more detail. The LVDS driver 120 shares all the features of the LVDS driver 120 of FIG. 1. In this example the voltage limiter comprises a first regulating transistor M4, in series between the switch SW1_P and first output lvds_p, and a second regulating transistor M5, in series between switch SW2_P and second output lvds_n. The first and second voltage regulating transistors M4, M5 are matched transistors, and regulate the voltage at the first and second output lvds_p, lvds_n based on the control voltage $V_{ctrl}$ at their gate.

The regulator 110 comprises a buffer that is configured to buffer the reference voltage $V_{ref}$ and provide a buffered output voltage $V_1$. The buffer comprises first NMOS buffer transistor M1 and a second, matched, NMOS buffer transistor M2. The reference voltage $V_{ref}$ is provided to the gate of the first buffer transistor M1. A current mirror comprising a pair of PMOS upper transistors is connected between a supply voltage Vcc_H and the drain of each of the first and second buffer NMOS transistors M1, M2. The drain of M2 is connected to the gate of M2.

For nominally matched transistors M1, M2, the voltage $V_1$ is nominally identical to the reference voltage $V_{ref}$. The reference voltage $V_{ref}$ is therefore copied by the buffer with an error proportional to the variation of the threshold voltages of M1 and M2.

The third transistor M3 is an NMOS transistor that is matched with the first and second voltage regulating transistors M4 and M5. The third transistor M3 has voltage $V_1$ connected to its source, and is biased by a current source connected to the drain of M3 and a current sink, sinking current from the source of M3. The current bias (I1) may be relatively low (e.g. below 1 mA) in order to limit current consumption when the voltage limiter 125 is in operation.

The gate of the third transistor M3 is connected to the gate of the first and second voltage limiting transistors M4, M5, to provide the control voltage $V_{ctrl}$ thereto. Transistors M3, M4 and M5 may be selected to have identical dimensions. The choice of M4 and M5 device size is a trade-off between parasitic capacitance (C) and conducting resistance ($R_{on}$). Larger regulation devices present lower $R_{on}$, but at the expense of a high parasitic capacitance. A high parasitic capacitance may increase the rise time and fall time of output signals, which may not be acceptable. The lower $R_{on}$ of larger devices will, however, help preserving the swing of the LVDS driver 120 in normal operating conditions. A compromise needs to be made to get acceptable rise/fall time with no degradation on output swing.

The below equations explain the operation of the regulator 110 with the LVDS driver 120

$$V_1 = V_{ref} (VgsM1 = VgsM2) \quad (1)$$

$$V_{ctrl} = V_1 + VgsM3 \text{ (by inspection of the circuit diagram)} \quad (2)$$

$$VsM4 = V_{ctrl} - VgsM4 \text{ (again, by inspection)} \quad (3)$$

$$VgsM3 = VgsM4 \text{ (for matched M3 and M4)} \quad (4)$$

$$\text{so } VsM4 = V_{ref} \text{ (by substitution)} \quad (5)$$

This arrangement therefore results in the voltage at the source of the first and second voltage limiting transistors M4 and M5 being limited to $V_{ref}$, which limits the voltage on the first and second output lvds_p and lvds_n to $V_{ref}$. In this example the clamping voltage is therefore equal to the reference voltage, but other relationships are contemplated (in other arrangements there may be an offset and/or a proportional relationship between the reference voltage and the clamping voltage).

The regulator 110 further comprises means for enabling and disabling the voltage limiting of the LVDS driver 120. A clamp enable switch SW2 is provided, operable to connect and disconnect the gate voltage $V_{ctrl}$ from the gate of each of the first and second voltage limiting transistors M4, M5. A clamp removal switch SW1 is provided, operable to connect and disconnect a supply voltage Vcc_H with the gate of each of the first and second voltage limiting transistors M4, M5. When voltage limiting is required, SW1 is open, and SW2 is closed, so $V_{ctrl}$ is applied to limit the voltage on the LVDS conductors lvds_p, lvds_n. When voltage limiting is not required, SW1 is closed and SW2 is open. The series resistance of the first and second voltage limiting transistors M4, M5 is consequently reduced because transistors M4, M5 are saturated by the supply voltage Vcc_H at their respective gates.

Figure 4:
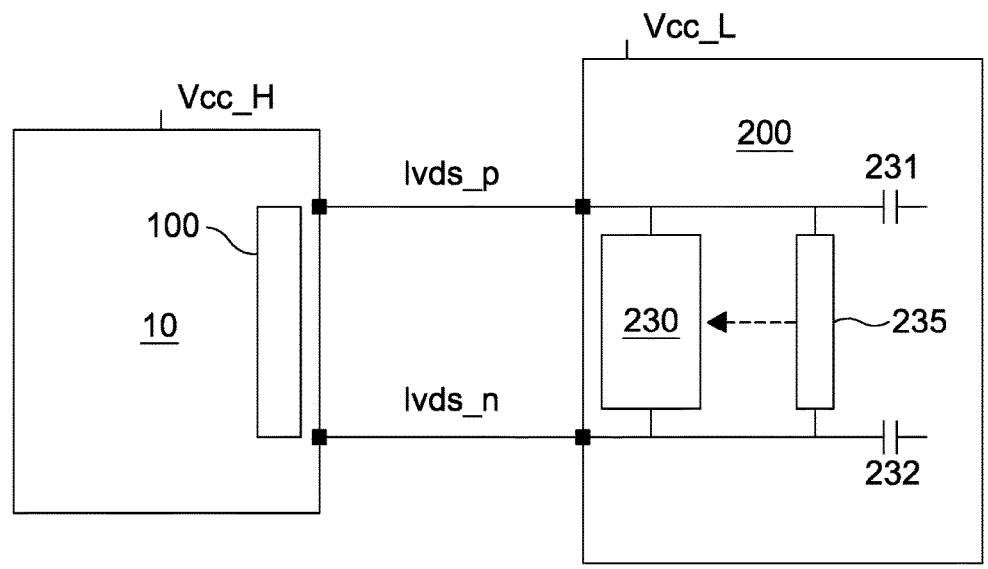
FIG. 4 is a block diagram of an example system, illustrating the integration of an LVDS device in a first integrated circuit, and an LVDS receiver in a second integrated circuit.

FIG. 4 shows an example system, comprising a first integrated circuit 10 and second integrated circuit 200. The first integrated circuit 10 may comprise a radar transceiver, implemented in a bipolar CMOS heterojunction technology with a first supply voltage Vcc_H. The second integrated circuit 200 may comprise a micro-controller implemented in a low voltage silicon CMOS technology with a second (lower) supply voltage Vcc_L. A device 100 comprising an LVDS driver is implemented in the first integrated circuit 10, for example for communicating a clock signal from the first integrated circuit 10 to the second integrated circuit 200, via the first and second connectors lvds_p and lvds_n. As already mentioned above, if a conventional LVDS driver is used in the first integrated circuit 10, the different process technologies may result in the potential for the LVDS driver of the first integrated circuit to cause an over-voltage condition at the second integrated circuit 200, depending on the load termination state.

One way to avoid such an over-voltage condition at the second integrated circuit 200 would be to decouple the first and second LVDS conductors lvds_p, lvds_n from the second integrated circuit 200 by placing a first and second decoupling capacitor in series between the first LVDS conductor lvds_p and second integrated circuit 200 and the second LVDS conductor lvds_n and second integrated circuit 200 respectively, with a termination resistance provided on the first integrated circuit side of the capacitors.

This would allow the first integrated circuit 10 to drive the LVDS conductors lvds_p, lvds_n at a (relatively) high voltage without damaging the second integrated circuit 200 (because the LVDS conductors are decoupled from the second integrated circuit 200). However, this approach requires components that are external to the first and second integrated circuit 10, 200, as well as potentially compromising system performance.

The use of a LVDS driver with voltage limiting overcomes this problem. Specifically the voltage on the first and second LVDS conductors lvds_p, lvds_n may be limited to a programmable reference voltage $V_{ref}$.

In the example of FIG. 4, the second integrated circuit comprises a termination circuit 230, comprising a termination resistance and common mode voltage biasing means. The termination circuit 230 may be controlled by a control signal from a control arrangement 235. The control arrangement 235 may be configured to provide a enable control signal to the termination circuit 230.

Figure 5:
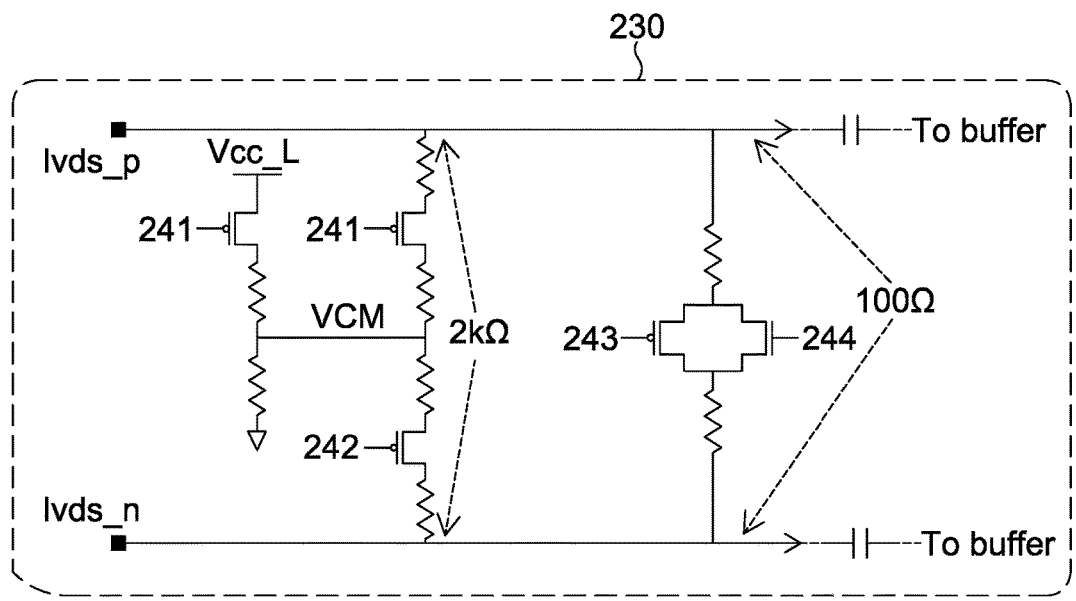
FIG. 5 is a schematic circuit diagram of an example switchable termination resistance.

FIG. 5 illustrates an example termination circuit 230, which includes a switchable termination resistance of 100 ohms connected between the first and second conductor lvds_p, lvds_n. The 100 ohm termination is enabled by providing a termination enabling signal 243, 244 to the complementary pair of n and p-type transistors that are connected in series with the 100 ohm resistance. The 100 ohm resistor can be split in two series resistors of 50 ohm, with switches 243, 244 placed between both resistors. When the transistors are saturated by the enabling signal 243, 244, the 100 ohm termination resistance is enabled. When the transistors are not saturated, the termination resistance may be much higher. This switchable termination resistance allows the inputs of the second integrated circuit (e.g. a MCU) to be used for other purposes than receiving an LVDS clock signal (which may require a high impedance between inputs). However, during a startup period of the second integrated circuit, the termination resistance may not be enabled. Without voltage limitation on the driver side, a high termination resistance will result in the voltage at the second integrated circuit rising as a result of the current driven through the high impedance. One advantage of a voltage limited LVDS driver 120 described herein is therefore to enable the use of a termination circuit with switchable termination resistance without concomitant risk of over-voltage. The series voltage limiter 125 will prevent over-voltage on the lvds conductors for any termination impedance.

The termination circuit 230 further comprises a common mode voltage biasing means, comprising a resistive divider arrangement that is enabled by switching on transistors with a common mode enabling signal 241, 242.

The termination circuit 230 may further comprise de-coupling capacitors for providing the LVDS signal (e.g. a clock) to a buffer of the second integrated circuit 200.

Figure 6:
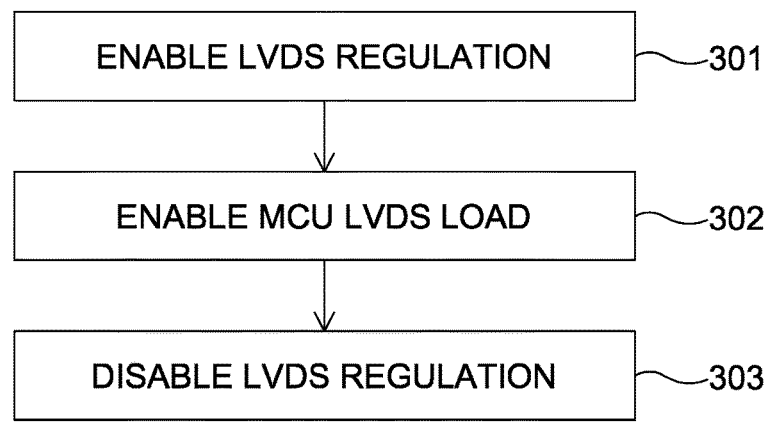
FIG. 6 is a flow diagram of an example method.

An example method of using a first integrated circuit with regulated LVDS driver voltage with a second integrated circuit with switchable termination resistance is illustrated in FIG. 6. At the first step 301, LVDS voltage regulation may be enabled at an LVDS driver. This operating mode is suitable for a startup period of a micro-controller, during which time a 100 ohm termination (or other appropriate LVDS termination resistance) may not yet be enabled. At step 302, the LVDS termination resistance is enabled, so that the LVDS current will no longer result in an over-voltage condition at the second integrated circuit. At step 303, the LVDS voltage regulation may be disabled, which may enable improved performance of the LVDS communication interface (for example due to reduced series resistance in the LVDS driver).

Figure 7:
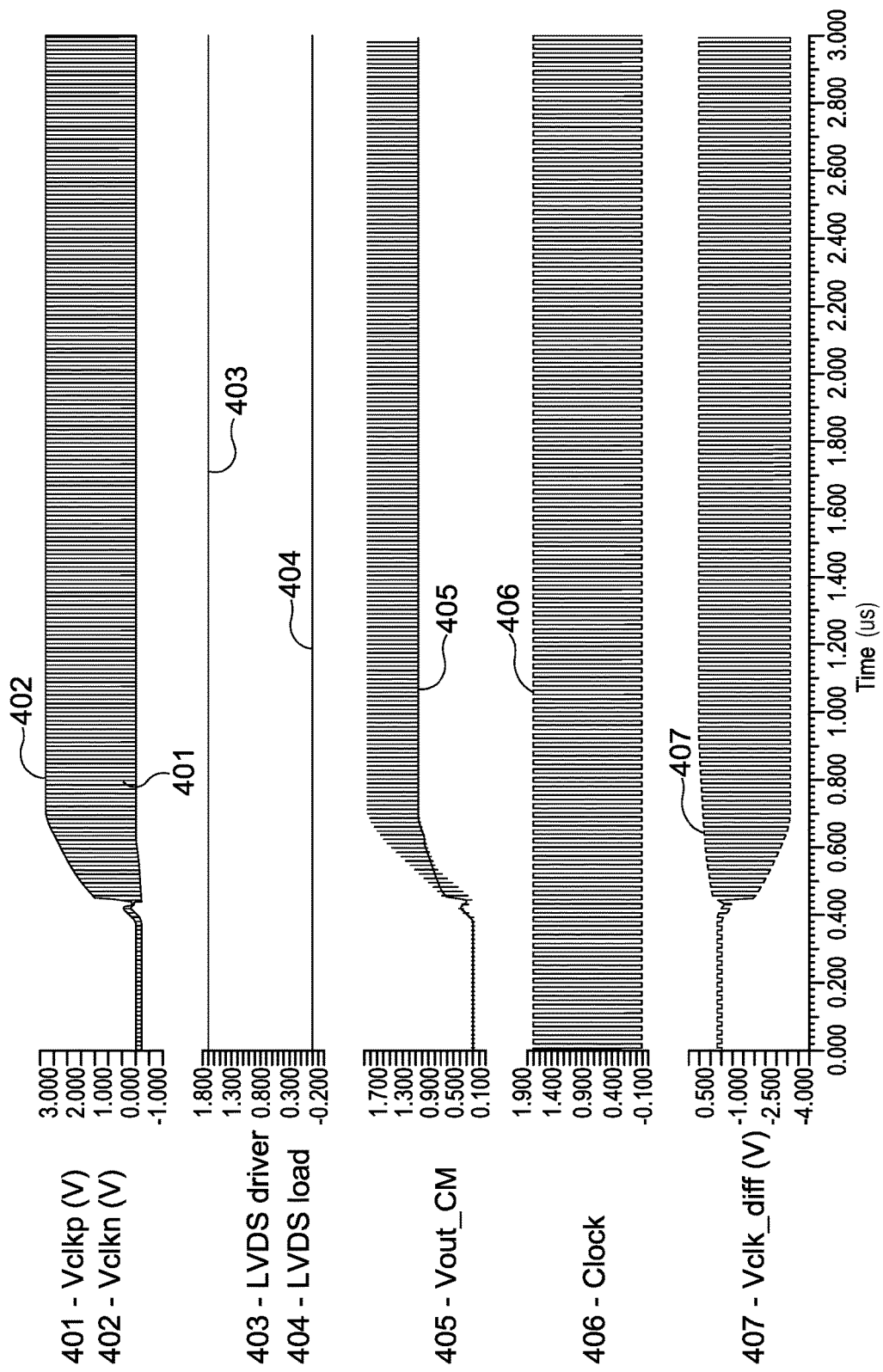
FIG. 7 shows results from a simulation of an LVDS driver injecting current into a high impedance termination, where a voltage limiter is not used.

FIG. 7 shows example simulation results obtained from an LVDS driver without voltage regulation, driving an LVDS signal into an LVDS receiver with a high impedance, as shown in FIG. 5, when the 100 ohm termination is not enabled. The signals shown are: voltage on the first and second LVDS conductor 401, 402; LVDS driver enabled 403, LVDS load enable 404; common mode voltage 405, LVDS driver input signal or clock 406, clock differential voltage 407.

After a settling period, the voltage 401, 402 on the LVDS conductors swings between 0V and 3.3V with each clock cycle. The LVDS driver is enabled for the whole simulation period, and the 100 ohm LVDS load is disabled for the whole simulation period. The common mode voltage 405 reaches a mean value of around 1.5V, with excursions to around 1.8V at each clock transition. These simulation results correspond with a 3.5 mA LVDS current drive, and with a floating common mode voltage bias, and the voltage levels are sufficient to damage a low voltage CMOS device, which may have an operating supply voltage of less than 1.4V.

Figure 8:
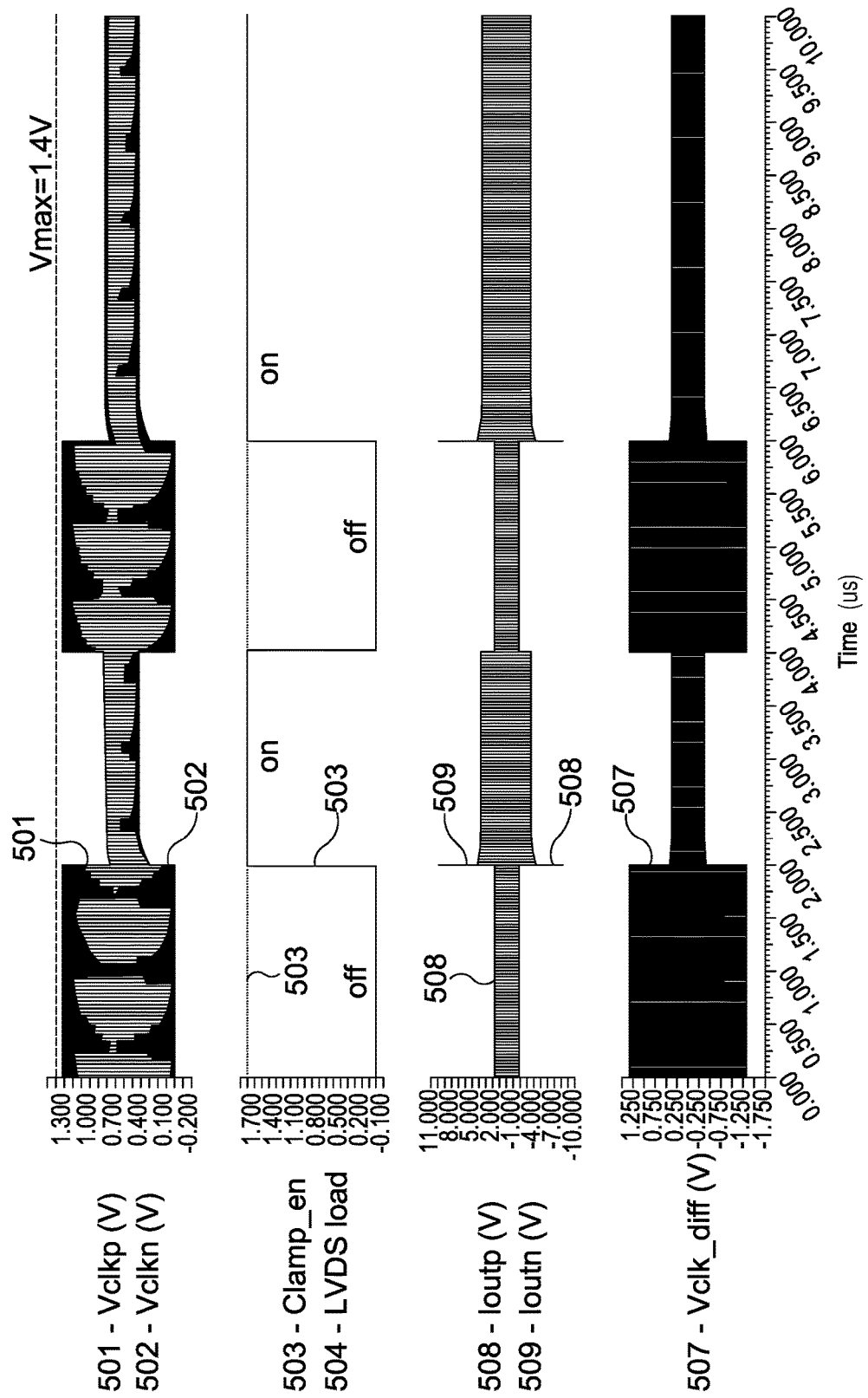
FIG. 8 shows results from a simulation of a device in which the voltage limiter is enabled and disabled at different times.

FIG. 8 shows simulation results illustrating the effect of the voltage limiter as the 100 ohm LVDS termination in FIG. 5 is switched on and off. The signals shown are: voltage on the first and second LVDS conductor 501, 502; voltage limiting enabled 503 (e.g. SW1 open and SW2 closed in the example of FIG. 3), LVDS load enable 504; clock differential voltage 507; the output current 508 flowing on positive conductor lvds_p; and the current 509 flowing on negative conductor lvds_n.

The voltage limiter remains enabled throughout the simulation, and the 100 ohm termination resistance is enabled and disabled. The voltage limiter prevents the voltages 501, 502 from exceeding 1.4V (the value of $V_{ref}$ that was set for this simulation), and the potentially damaging over-voltage condition is prevented.

Figure 9:
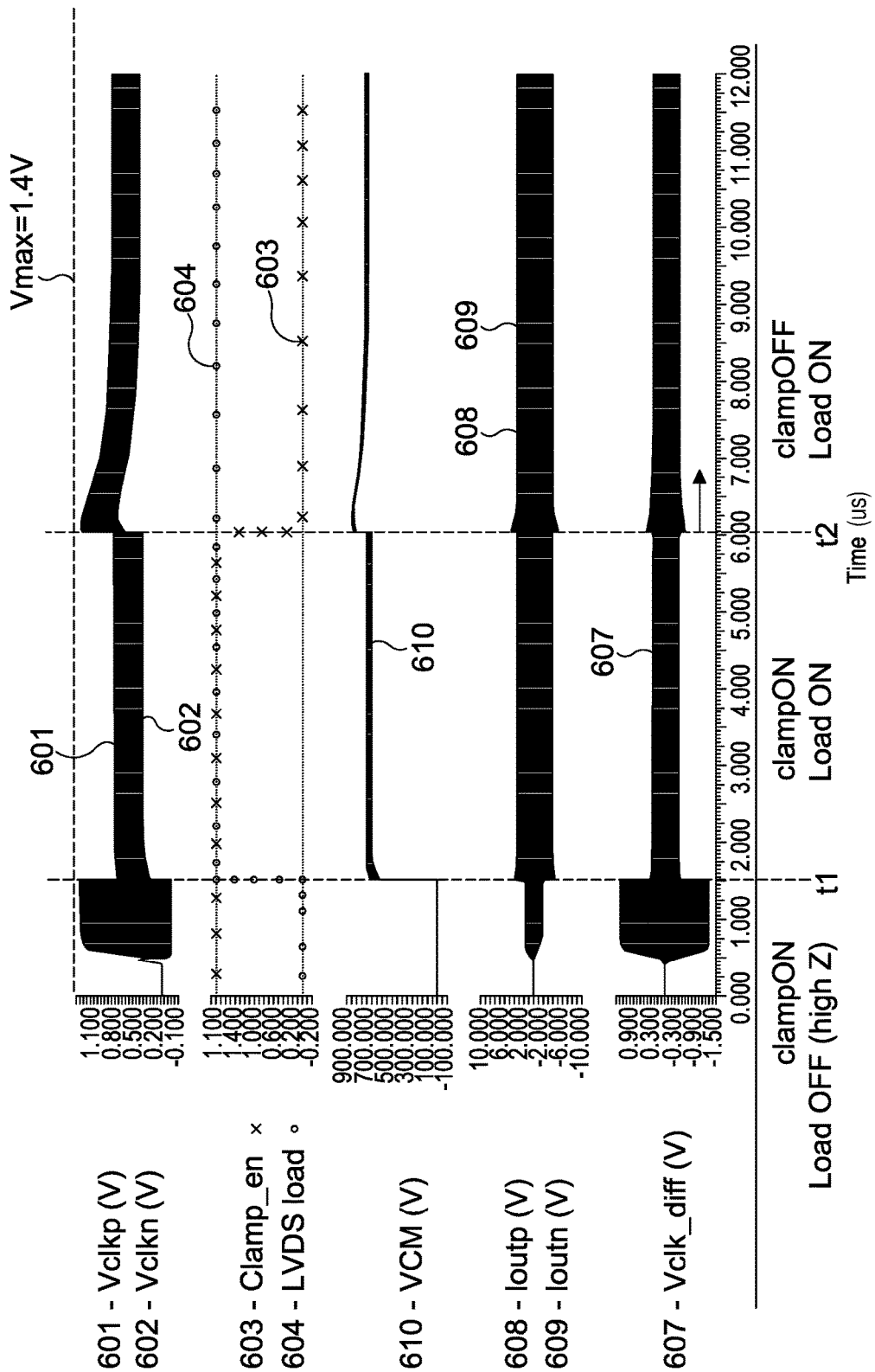
FIG. 9 shows results from a second simulation of a device, in which a voltage limiter and switchable termination resistance are enabled in sequence.

FIG. 9 shows the results of a simulation illustrating an operating method which may be appropriate for communicating very high speed signals. The signals shown are: voltage on the first and second LVDS conductor 601, 602; voltage limiting enabled 603 (e.g. SW1 open and SW2 closed in the example of FIG. 3), LVDS load enable 604; common mode voltage 610; the current 608 on conductor lvds_p, the current 609 on conductor lvds_n and the clock differential voltage 607.

For t<t1, the driver operates in a protected mode, with the voltage limiter enabled (603 is high), limiting the voltages 601, 602 to less than 1.4V. The LVDS load (nominally 100 ohms) is not engaged (for example corresponding with a micro-controller startup period), and nor is the common mode voltage generated inside the second integrated circuit. The common mode voltage 610 is therefore approximately zero, and the clock differential voltage swings between approximately +−1.2V.

For t1<t<t2, the voltage limiter remains engaged (603 is high), and the LVDS load and common mode voltage is enabled, with the result that the clock differential voltage is reduced to approximately 350 mV, and the common mode voltage is around 600 mV. The drive current in this example is 3.7 mA, so the clock differential voltage is slightly lower than would be expected, due to the non-negligible series resistance of the voltage limiter.

At t>t2, the voltage limiter is disabled or shunted (for example by saturating voltage limiting transistors), reducing their R. After a short settling period, the common mode voltage 610 returns to around 600 mV, and the clock differential voltage settles to around 370 mV, showing that the series resistance of the voltage limiter is substantially negligible.

One application for a LVDS driver according to the present disclosure is in a radar system.

From reading the present disclosure, other variations and modifications will be apparent to the skilled person. Such variations and modifications may involve equivalent and other features which are already known in the art of LVDS systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A Low Voltage Differential Signaling (LVDS) device, comprising:
   a first pair of switches configured to drive current from a first output to a second output through a differential signaling circuit;
   a second pair of switches configured to drive current from the second output to the first output through the differential signaling circuit; and
   a voltage limiter, connected in series with the first pair of switches and the second pair of switches, that is configured to receive a control voltage, and, responsive to the control voltage, to limit a voltage at both the first output and the second output to less than a clamping voltage for both the first output and the second output when current is driven through the differential signaling circuit, wherein the clamping voltage is equal to a reference voltage used to generate the control voltage.

2. The LVDS device of claim 1, wherein the voltage limiter further comprises:
   a first regulating transistor in series with the first pair of switches; and
   a second regulating transistor in series with the second pair of switches, wherein the control voltage is applied to respective gates of each of the first regulating transistor and the second regulating transistor.

3. The LVDS device of claim 1, further comprising:
   a programmable voltage generator configured to provide a reference voltage.

4. The LVDS device of claim 1, further comprising:
   a regulator configured to generate the control voltage from the reference voltage.

5. The LVDS device of claim 4, wherein the regulator further comprises:
   a buffer configured to receive the reference voltage and provide a buffered output voltage substantially equal to the reference voltage.

6. The LVDS device of claim 5, wherein the buffer further comprises:
   a first buffer transistor; and
   a second buffer transistor, wherein the first buffer transistor and the second buffer transistor are configured with a nominally identical threshold voltage.

7. The LVDS device of claim 6, wherein the regulator further comprises:
   a third buffer transistor, wherein the buffered output voltage is provided to a source of the third buffer transistor, and the control voltage is provided from a gate of the third buffer transistor.

8. The LVDS device of claim 7, wherein the first buffer transistor, the second buffer transistor, and the third buffer transistor are configured with the nominally identical threshold voltage.

9. The LVDS device of claim 4, wherein the regulator further comprises:
   a clamp enable switch configured to connect and disconnect the control voltage from the voltage limiter.

10. The LVDS device of claim 4, wherein the regulator further comprises:
    a clamp removal switch configured to provide a control voltage that: causes the voltage limiter to stop voltage limiting and reduces an effective series resistance of the voltage limiter.

11. A system comprising: a first integrated circuit comprising the LVDS device of claim 1, and a second integrated circuit, the second integrated circuit comprising an LVDS receiver configured to receive LVDS signals from the device of the first integrated circuit.

12. The system of claim 11, wherein process technology of the first integrated circuit is different from process technology of the second integrated circuit.

13. The system of claim 11, wherein the first integrated circuit has a first nominal supply voltage that is greater than a maximum operating voltage of the second integrated circuit.

14. The system of claim 11, wherein the second integrated circuit comprises a switchable termination resistance for the differential signaling circuit, configured in a first state to provide a first termination resistance between a first output and a second output of the differential signaling circuit, and configured in a second state to provide a second termination resistance that is lower than the first termination resistance between the first output and the second output of the differential signaling circuit.

15. The system of claim 11, configured to during a startup period of the second integrated circuit, enable voltage regulation using the voltage limiter, and after the startup period, disable voltage regulation by the voltage limiter.

* * * * *